(12) United States Patent
Ramdani et al.

(10) Patent No.: US 8,115,196 B2
(45) Date of Patent: Feb. 14, 2012

(54) HIGH PERFORMANCE SIGE:C HBT WITH PHOSPHOROUS ATOMIC LAYER DOPING

(75) Inventors: Janial Ramdani, Scarborough, ME (US); Craig Richard Printy, Buxton, ME (US); Thanas Budri, Portland, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 13/031,496

(22) Filed: Feb. 21, 2011

(65) Prior Publication Data

US 2011/0180848 A1    Jul. 28, 2011

Related U.S. Application Data

(62) Division of application No. 11/367,030, filed on Mar. 2, 2006, now Pat. No. 7,892,915.

(51) Int. Cl.
    *H01L 31/00* (2006.01)

(52) U.S. Cl. ........... 257/19; 438/172; 438/235; 438/775

(58) Field of Classification Search ................ 438/775, 438/172, 235; 257/19
    See application file for complete search history.

(56) References Cited

U.S. PATENT DOCUMENTS

| | | | |
|---|---|---|---|
| 5,567,638 A | 10/1996 | Lin et al. | |
| 5,793,109 A * | 8/1998 | Nakamura | 257/745 |
| 6,255,149 B1 | 7/2001 | Bensahel et al. | |
| 6,323,525 B1 | 11/2001 | Noguchi et al. | |
| 6,355,561 B1 | 3/2002 | Sandhu et al. | |
| 6,709,941 B2 | 3/2004 | Fujimaki | |
| 6,723,621 B1 | 4/2004 | Cardone et al. | |
| 6,750,119 B2 | 6/2004 | Chu et al. | |
| 6,800,522 B2 | 10/2004 | Lee | |
| 6,800,552 B2 * | 10/2004 | Elers et al. | 438/680 |
| 7,145,167 B1 | 12/2006 | Chu | |
| 2002/0109135 A1 | 8/2002 | Murota et al. | |
| 2002/0163013 A1 | 11/2002 | Toyoda et al. | |
| 2002/0185708 A1 | 12/2002 | Coolbaugh et al. | |
| 2003/0201461 A1 | 10/2003 | Sato et al. | |
| 2003/0207593 A1 | 11/2003 | Derderian et al. | |
| 2004/0048439 A1 * | 3/2004 | Soman et al. | 438/309 |

FOREIGN PATENT DOCUMENTS

JP    05102177 A    4/1993

OTHER PUBLICATIONS

Jay P. John, et al., "Optimization of a SiGe:C HBT in a BiCMOS Technology for Low Power Wireless Applications", Digital DNA Laboratories, 4 pages.

Bernd Tillack, et al., "Atomic layer processing for doping of SiGe", Thin Solid Films (2005), 5 pages.

(Continued)

*Primary Examiner* — David Vu
*Assistant Examiner* — Brandon Fox

(57) ABSTRACT

A base structure for high performance Silicon Germanium: Carbon (SiGe:C) based heterojunction bipolar transistors (HBTs) with phosphorus atomic layer doping (ALD) is disclosed. The ALD process subjects the base substrate to nitrogen gas (in ambient temperature approximately equal to 500 degrees Celsius) and provides an additional SiGe:C spacer layer. During the ALD process, the percent concentrations of Germanium (Ge) and carbon (C) are substantially matched and phosphorus is a preferred dopant. The improved SiGe:C HBT is less sensitive to process temperature and exposure times, and exhibits lower dopant segregation and sharper base profiles.

20 Claims, 3 Drawing Sheets

OTHER PUBLICATIONS

B. Tillack, et al., "Atomic layer doping of SiGe—fundamentals and device applications", Thin Solid Films 369 (2000), p. 189-194.

B. Tillack, et al., "Atomic layer doping of SiGe by low pressure (rapid thermal) chemical vapor deposition", Thin Solid Films 294 (1997), p. 15-17.

Y. Shimamune, et al., "Atomic-layer doping in Si by alternately supplied PH3 and SiH4", Thin Solid Films 380 (2000), p. 134-136.

"SiGe:C Technology", Motorola, 2001, 2 pages.

Yosuke Shimamune, et al., "Formation of heavily P-doped Si epitaxial film on Si( 1 0 0) by multiple atomic-layer doping technique", Applied Surface Science 224 (2004), p. 202-205.

"SiGeC Heterojunction Bipolar Transistors" Doctoral Thesis by Erdal Suvar, Stockholm, Sweden, 2003, Laboratory of Solid State Devices, Department of Microelectronics and Information Technology (IMIT), Royal Institute of Technology (KTH), 73 pages.

Beillard, P., "N2 as carrier gas: an alternative to H2 for enhanced epitaxy of Si, SiGe, and SiGe:C", Applied Surface Science, vol. 224, Issues 1-4, Mar. 15, 2004, p. 31-35.

B. Tillack, "High Performance SiGe:C HBT's using atomic layer base doping", Mar. 15, 2004, Applied Surface Science, vol. 224, Issues 1-4, p. 55-58.

B. Tillack, "Atomic Control of doping during SiGe Epitaxy", Apr. 15, 1998, Thin Solid Films, vol. 318, Issues 1-2, p. 1-5.

Y. Shimamune, "Atomic layer adsorption of P on Si(100) and Ge(100) by PH3 using ultraclean low pressure chemical vapor deposition", Aug. 1, 2000, Applied Surface Science, vols. 162-163, p. 390-394.

N. Sugi, "Atomic layer doping in SiGe/Si heterostructures by two-step solid phase epitaxy", Apr. 1999, Japanese Journal of Applied Physics, vol. 38, p. 2424-2426.

\* cited by examiner

HIGH PERFORMANCE SIGE:C HBT WITH PHOSPHOROUS ATOMIC LAYER DOPING

This application is a divisional of prior U.S. patent application Ser. No. 11/367,030 filed on Mar. 2, 2006, which issued on Feb. 22, 2011 as U.S. Pat. No. 7,892,915.

TECHNICAL FIELD OF THE INVENTION

The present invention is directed, in general, to atomic layer doping (ALD), and more specifically, to a high performance Silicon Germanium:Carbon (SiGe:C) based heterojunction bipolar transistors (HBTs) with phosphorous ALD.

BACKGROUND OF THE INVENTION

ALD is a method in which deposition of an atomic layer of material is controlled by a pre-deposited layer of a precursor. ALD processes typically promote the adsorption of gases into a substrate and hence the deposition of an atomic layer of material on the substrate. By alternating the supply of a reaction gas and a purging gas, ALD processes can uniquely control the deposition of material on a substrate at an atomic level. For example, when a reaction gas (or precursor) is exposed to a substrate surface, atoms of the reaction gas are chemically adsorbed into the substrate. The reaction gas is then purged by exposing the substrate to a purging gas. The purging gas ideally only reacts with the substrate where the reaction gas had been previously adsorbed. The resulting chemical reaction eventually forms an atomic layer of material onto the substrate surface. ALD thus provides unique control of the doping dosage and doping location at an atomic level, allowing for selective layer growth and both single and double layer dopant coverage.

Conventional ALD applications aid in meeting microscaled production requirements. ALD applications are typically ideal for abrupt, localized highly doped structures with relatively sharp profiles and provide little or no interaction with the growing layer. Conventional ALD doping, in a hydrogen gas ambient, generally provides high segregation of the dopant (in most cases phosphorus) and a broad profile. Thus, conventional ALD processes limit (direct current) DC and (radio frequency) RF performance. Important band engineering factors such as the gain, Early voltage, voltage between the base and collector and cutoff frequency are adversely affected.

Conventional silicon-based bipolar junction transistors (BJTs) have been a dominant semiconductor device since the advent of the integrated circuit. Many other semiconductor materials outperform silicon-based devices. However, because most semiconductors are incompatible with the silicon-based process technologies, the development of such materials has not been forthcoming. Silicon Germanium (SiGe) and Silicon Germanium:Carbon (SiGe:C) have been recent exceptions.

SiGe:C allows for band-gap engineering, which in turn provides improvements in high speed and high frequency performance. A principle application of SiGe:C has been with heterojunction bipolar transistors (HBTs). The base of an HBT is the most heavily doped region of the transistor and is thus a prime area for band-gap engineering. SiGe:C HBTs generally offer a higher unity gain frequency, lower noise, higher collector currents and better linearity than the conventional silicon BJT. Moreover, SiGe:C HBTs may be integrated with existing CMOS technologies, keeping production costs for low powered, high performance products relatively low.

There is, therefore, a need in the art for an ALD system in which there is low segregation of a dopant and less sensitivity to temperature and exposure time. There is also a need for an improved system for producing high performance SiGe:C based HBTs with phosphorous ALD.

SUMMARY OF THE INVENTION

The present disclosure generally provides a process and base structure for high performance Silicon Germanium:Carbon (SiGe:C) based heterojunction bipolar transistors (HBT) with phosphorous atomic layer doping (ALD).

In an embodiment of the disclosure, an atomic layer doping method is provided. The method comprises flowing nitrogen gas adjacent to a substrate; purging the substrate with a dopant; reacting a surface of the substrate to form an atomic layer of a compound; and flowing a second gas adjacent to the substrate. The compound may be a phosphorous ALD layer. The dopant may be phosphorus and the second gas may be hydrogen. The atomic layer doping method is preferably performed in an ambient of about 500 degrees Celsius. The method may further comprise growing a first SiGe:C layer prior to flowing the nitrogen gas adjacent to the substrate, wherein the percentage concentrations of Germanium (Ge) and carbon (C) comprising the first SiGe:C layer are substantially matched. The method may also include growing a SiGe:C spacer layer, wherein the percentage concentrations of Ge and C comprising the SiGe:C spacer layer are substantially matched. The method may further include growing a silicon cap layer.

In another embodiment of the disclosure, a transistor base structure is provided. The transistor base structure comprises a SiGe:C layer; an ALD layer adjacent to the SiGe:C layer; and a SiGe:C spacer adjacent to the ALD layer, wherein the SiGe:C spacer layer is grown in a nitrogen ambient. The transistor base structure may include an ALD layer doped with phosphorus, a silicon buffer layer adjacent to the SiGe:C layer and a silicon cap layer adjacent to the SiGe:C spacer. The transistor may be a SiGe:C HBT. A secondary ion mass spectrometry (SIMS) profile of dopant concentration as a function of depth for the transistor base structure is preferably about 6 nanometers per decade.

In still another embodiment of the disclosure, a method for building a SiGe:C HBT base structure is provided. The method comprises growing a silicon cap layer adjacent to a silicon buffer; matching the percent concentration of Ge and C; and purging the Ge into the silicon cap layer to form a SiGe:C layer. The method also includes exposing the SiGe:C layer to an nitrogen ($N_2$) ambient at about 500 degrees Celsius; purging the SiGe:C layer with a dopant; and growing an ALD dopant layer adjacent to the SiGe:C layer at about 500 degrees Celsius. The method further includes growing a SiGe:C spacer layer in an $N_2$ ambient, wherein the SiGe:C spacer layer is adjacent to the ALD dopant layer; flowing a gas adjacent to the SiGe:C spacer layer; and growing a silicon cap layer adjacent to the SiGe:C spacer. The dopant may be phosphorus or a Group V element, while the gas may be hydrogen.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. It is also noted that the term "layer" may mean a single layer, a portion of a layer, a layer within a layer, a sub-layer and/or multiple layers. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 through 5, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
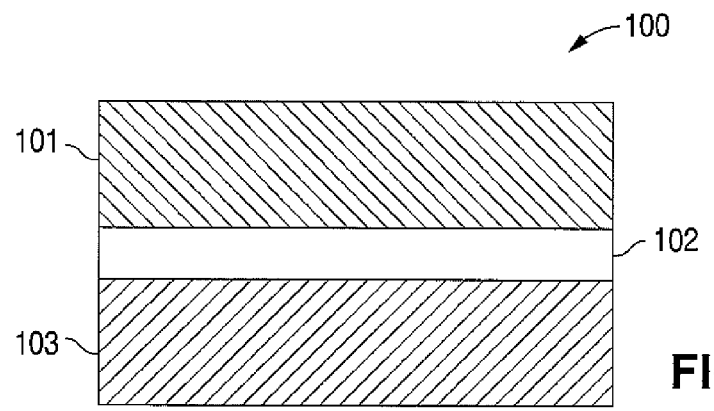
FIG. 1 depicts a simplified cross section of a conventional base structure 100 of a Silicon Germanium:Carbon (SiGe:C) based heterojunction bipolar transistor (HBT)

FIG. 1 depicts a simplified cross section of a conventional high performance Silicon Germanium:Carbon (SiGe:C) based heterojunction bipolar transistor (HBT) base structure 100. Two layers of SiGe:C 101 sandwich a dopant layer 102. The base regions of most conventional SiGe:C HBTs use phosphorus (P) as the dopant to form dopant layer 102.

Figure 2:
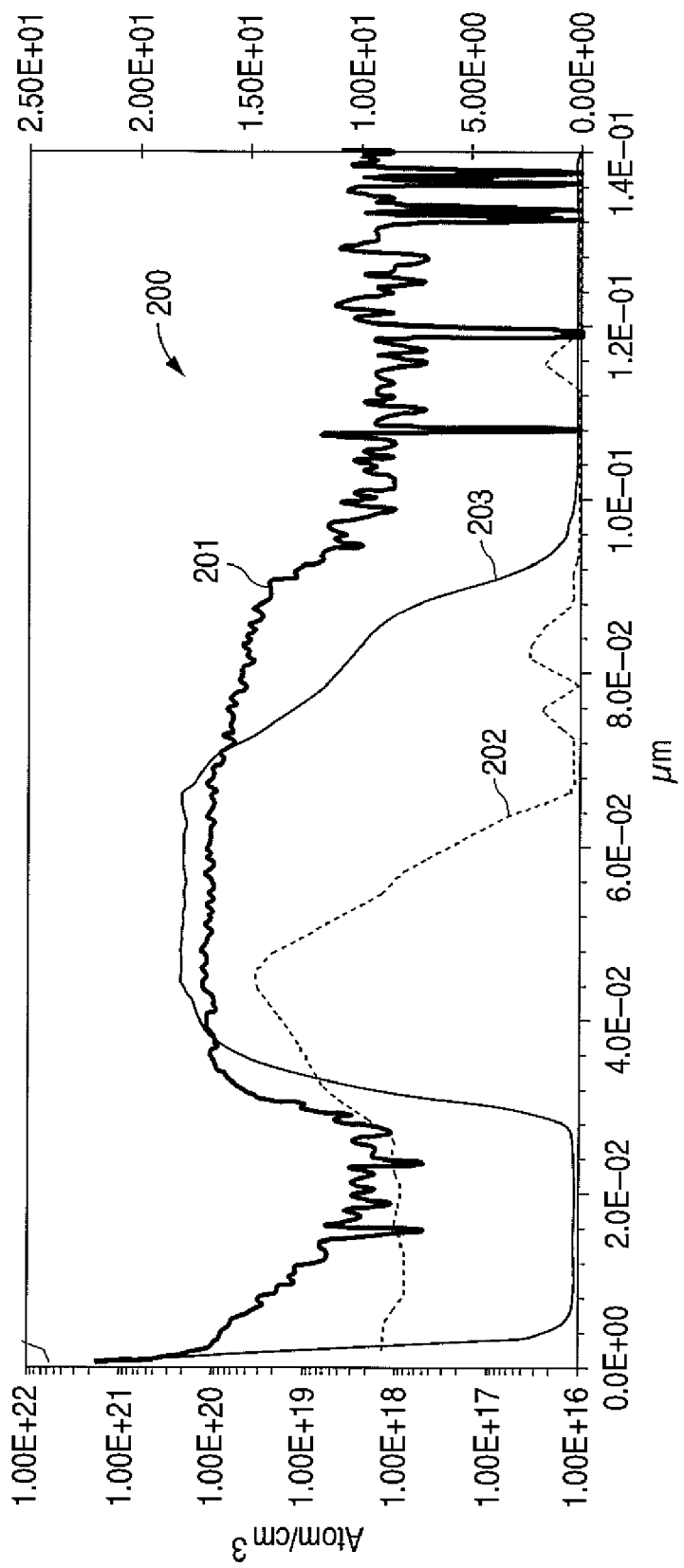
FIG. 2 is a secondary ion mass spectrometry (SIMS) profile of the dopant concentration in atoms per cubic centimeter (Atom/cm$^3$) as a function of depth in micrometers (μm) when conventional doping methods are used.

FIG. 2 depicts an example of a secondary ion mass spectrometry (SIMS) profile 200 of the dopant concentration, in atoms per cubic centimeter (Atom/cm$^3$), as a function of depth, in micrometers (μm), when conventional doping methods are used. In this case, the dopant, phosphorus (P), exhibits high levels of segregation as carbon (C) and Germanium (Ge) concentrations are varied. The concentration of C is shown by plot 201 and depicted by a thick solid line, while the concentration of Ge is shown by plot 203 and depicted by a thin solid line. The concentration of P, on the other hand, is shown by plot 202 and depicted by a dotted line. The overall dopant profile resulting from conventional doping methods is not very sharp, but in fact relatively broad. The steepness or sharpness of the resulting curve due to phosphorus segregation is approximately 20 nanometers per decade (20 nm/dec). High P segregation adversely affects important transistor characteristics such as the gain, Early voltage, voltage between the base and collector, and cutoff frequency. Accordingly, SiGe:C transistors made in accordance with conventional doping methods exhibit relatively poor RF and DC performance.

Figure 3:
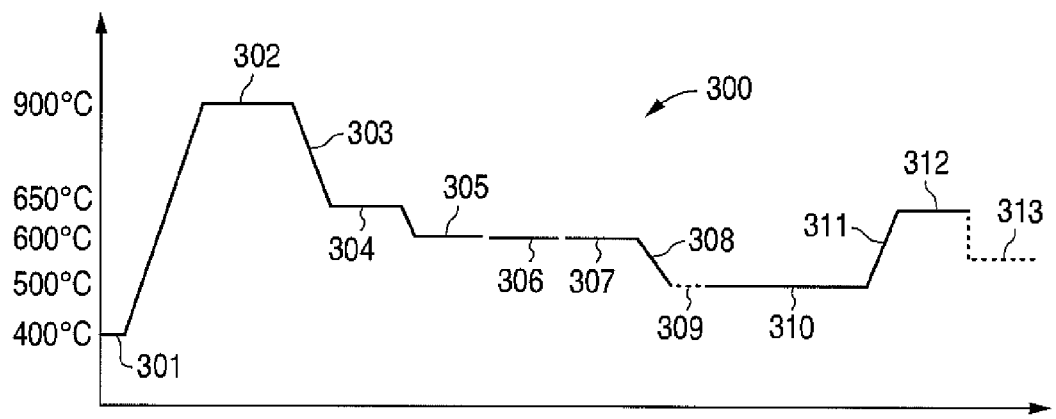
FIG. 3 depicts an exemplary process diagram for atomic layer doping (ALD) in accordance with an embodiment of the present disclosure.

FIG. 3 depicts an exemplary process diagram 300 for atomic layer doping (ALD) in accordance with an embodiment of the present disclosure. Process 300 begins at step 301 with a silicon surface layer 401a (see FIG. 4) in an ambient temperature of approximately 400 degrees Celsius (400° C.). Silicon surface layer 401a is baked at about 900° C.) in step 302 to remove any residual contaminant from the surface. Then, in step 303, silicon surface layer 401a is cooled to appropriately 600-650° C. At an ambient temperature of approximately 600° C., a silicon buffer layer 401b is grown on top of the silicon surface layer 401a in step 304. The thickness of silicon buffer layer 401b is grown to about 2-10 nm. Preferably, Si buffer layer 410b is grown to about 5 nm.

The concentration of Ge and C are preferably controlled to remain substantially matched during steps 305 through 310. Process 300 continues in steps 305 and 306, where the ambient temperature is kept at approximately 600° C. and two epitaxial layers of germanium (Ge) are purged into the silicon cap layer grown in step 304. Steps 305 and 306 control Ge grading from essentially zero to about 20%. Preferably, Ge grading is sustained at about 15% Ge. After purging the silicon cap layer grown in step 304 with Ge, a SiGe:C layer 402 (see FIG. 4) is formed in step 307. The thickness of SiGe:C layer 402 is generally kept between 30-100 nm. Preferably, SiGe:C layer 402 is about 50 nm thick. SiGe:C layer 402 is then exposed to an nitrogen (N$_2$) ambient and cooled to approximately 500° C. in step 308. Conventional ALD doping processes typically expose a SiGe:C layer to an H$_2$ ambient during the purging cycle.

Process 300 continues by maintaining the deposition temperature at about 500° C. in steps 309 and 310. This is a reduction in temperature over conventional ALD doping processes. At 500° C., doping segregation effects are minimized while maintaining a high epitaxial growth rate and complying with any other manufacturing requirements. In step 309, the epitaxial growth process is temporarily interrupted and the surface of the SiGe:C layer 402 is exposed to dopant, preferably P, for about one minute. The result is phosphorous ALD layer 403 (see FIG. 4). The concentration of dopant, P, is about $1\times10^{13}$ Atoms/cm$^2$ and $1\times10^{14}$ Atoms/cm$^2$. Preferably the concentration of dopant, P, is about $3.5\times10^{13}$ Atoms/cm$^2$. Although phosphorus is a preferred dopant, it should be understood that other dopants, such as Arsenic and Antimony, may also be used in accordance with the present disclosure.

After exposure to phosphorus in step 309, SiGe:C spacer 404 (see FIG. 4) is allowed to grow in an N$_2$ ambient for a predetermined amount of time in step 310. SiGe:C spacer 404 is grown to a thickness between about 2-20 nm. Preferably, SiGe:C spacer 404 is grown to about 10 nm. In step 310, the top surface of the SiGe:C spacer 404, is exposed to an N$_2$ ambient to aid eventually reducing vapor pressure (VP) autodoping due to any hydrogen carry-over or memory effect later in process 300. In step 311, the SiGe:C spacer 404 is exposed to a hydrogen ambient (H$_2$). At this stage of process 300 preferably exposes the SiGe:C spacer to an H$_2$ ambient rather than an N$_2$ ambient. At higher temperatures, an N$_2$ ambient would adversely react with silicon, while an H$_2$ ambient facilitates building a silicon cap faster than the same in an N$_2$ ambient.

Figure 4:
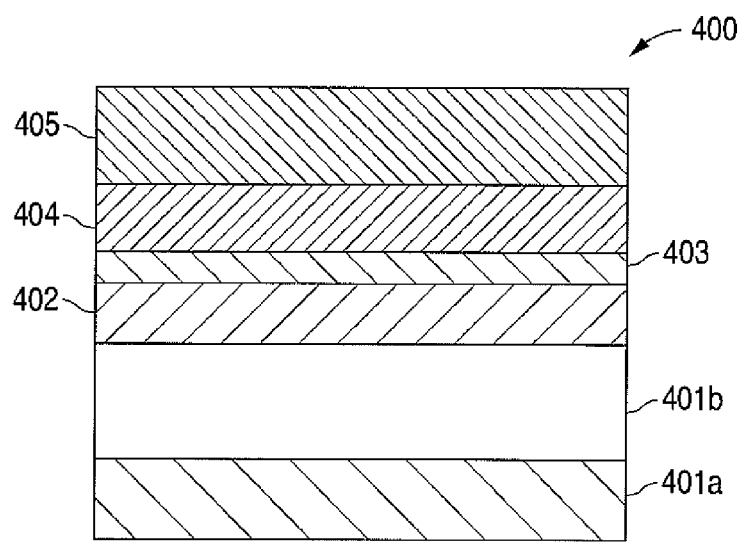
FIG. 4 depicts a simplified cross section of a base structure of embodiment of the present disclosure.

Process 300 continues in step 312 by increasing the ambient temperature to about 650° C. and growing a final silicon cap layer 405 (see FIG. 4). Silicon cap layer 405 is grown to a thickness between about 20 nm and 60 nm. Preferably, silicon cap layer 405 is about 40 nm thick. After cooling the temperature to about 600° C. in step 313, the resulting base structure 400 (see FIG. 4) may be removed. In summary, process 300 results in the exemplary base structure 400 illustrated in FIG. 4. Silicon surface layer 401a is topped with silicon buffer layer 401b. SiGe:C layer 402 is grown on top of silicon buffer layer 410b. A phosphorous ALD layer 403 is grown on top of the SiGe:C layer 402. The SiGe:C layer 402 is topped with a SiGe:C spacer 404. The resulting base structure 400 is finished off with a silicon cap layer 405.

Figure 5:
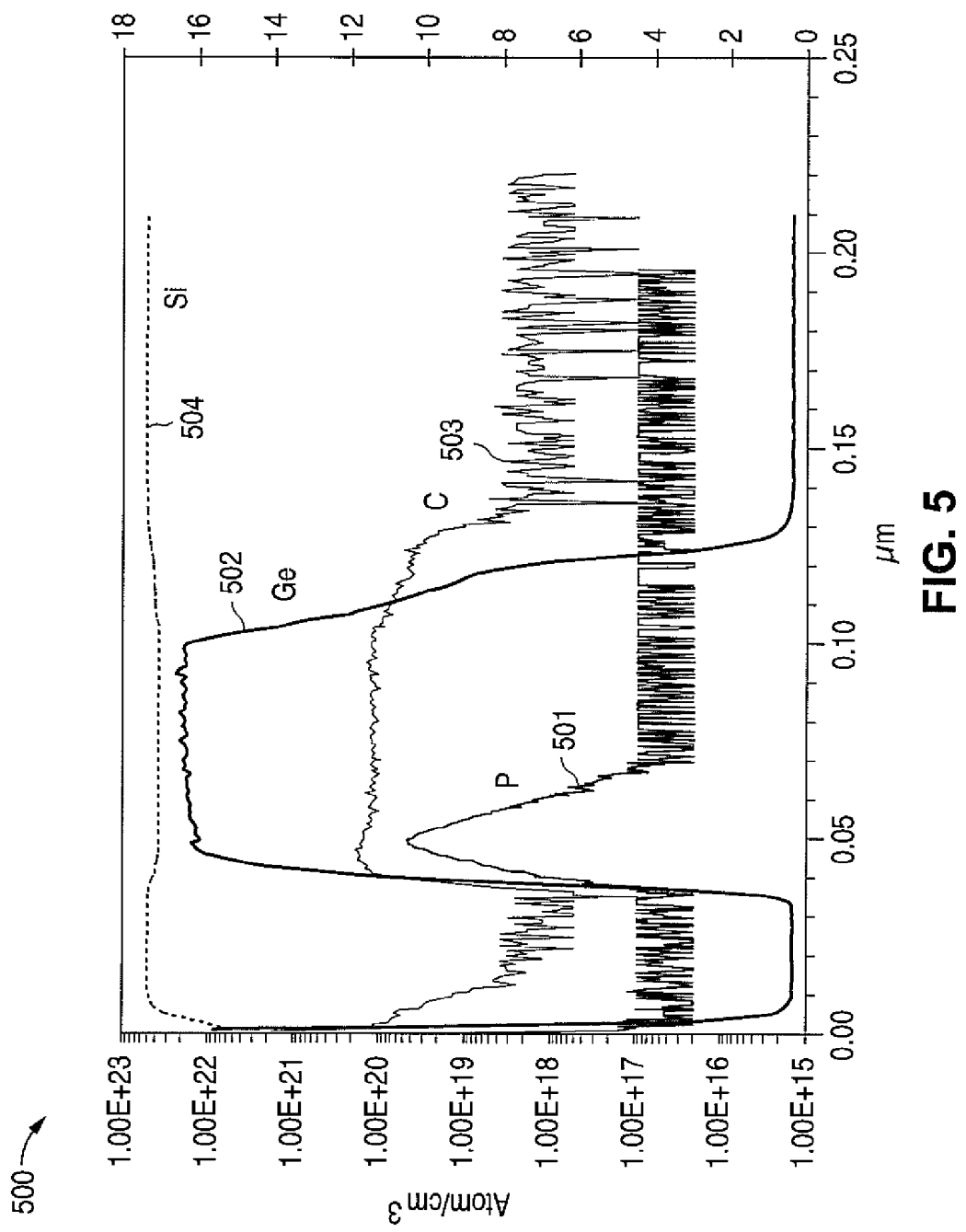
FIG. 5 depicts an example of a SIMS profile of the dopant concentration (atoms/cm$^3$) as a function of depth (μm) when exemplary doping methods in accordance with an embodiment of the present disclosure are used.

FIG. 5 depicts an example of a SIMS profile 500 illustrating dopant concentration (Atom/cm$^3$) as a function of depth (μm) when exemplary doping methods in accordance an embodiment of the present disclosure are used. The concentration of dopant, P, is shown by plot 501 in FIG. 5. On the other hand, the concentration of Ge is shown by plot 502, concentration of Silicon is shown by plot 504 and C show in plot 503. The concentrations of Ge (plot 502) and C (plot 503) are substantially matched prior and post phosphorous ALD. The steepness of the profile is optimized to about 6 nm/dec and full width at half maximum in less than 10 nm at 500° C. N$_2$. Preferably, the steepness of the profile should be minimized.

Thus, unlike conventional methods, preferred embodiments of the present disclosure match the percentage concentration of Ge and C during the ALD process, while controlling exposure to an ambient nitrogen at about 500° C. A SiGe:C spacer post ALD deposition in N$_2$ is absent from conventional methods. The steepness of the base profile is optimized to at least 6 nm/dec at 500° C. N$_2$ versus a 20 nm/dec at 600° C. H$_2$ exhibited by conventional methods. Accordingly, a robust process with sharp base profiles conducive for use in, for example, complimentary high speed BiCMOS where ALD techniques are is disclosed. Such techniques yield less sensitivity to process temperatures and make it possible to reduce exposure times while minimizing outdiffusion.

It is important to note that while the present invention has been described in the context of a fully functional process, those skilled in the art will appreciate that at least portions of the process are capable of adapting to a variations within the process without deviating from the preferred embodiments described above. Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A transistor base structure, comprising:
   a Silicon Germanium:Carbon (SiGe:C) layer;
   an atomic layer doping (ALD) layer adjacent to the SiGe:C layer; and
   a SiGe:C spacer adjacent to the ALD layer;
   wherein a secondary ion mass spectrometry (SIMS) profile of dopant concentration as a function of depth for the transistor base structure is about 6 nanometers per decade.

2. The transistor base structure according to claim 1, wherein the ALD layer is doped with phosphorus.

3. The transistor base structure according to claim 2, wherein a concentration of phosphorus is about $3.5*10^{13}$ atoms per square centimeter.

4. The transistor base structure according to claim 1, further comprising a silicon buffer layer adjacent to the SiGe:C layer.

5. The transistor base structure according to claim 1, further comprising a silicon cap layer adjacent to the SiGe:C spacer.

6. The transistor base structure according to claim 1, wherein the transistor base structure forms at least part of an SiGe:C heterojunction bipolar transistor (HBT).

7. The transistor base structure according to claim 1, wherein the profile of dopant concentration is approximately full width at half maximum in less than 10 nanometers.

8. A transistor base structure, comprising:
   a buffer layer;
   a Silicon Germanium:Carbon (SiGe:C) layer over the buffer layer;
   an atomic layer doping (ALD) layer over the SiGe:C layer, the ALD layer comprising a dopant;
   a SiGe:C spacer layer over the ALD layer; and
   a cap layer over the SiGe:C spacer layer;
   wherein a steepness of a profile of dopant concentration as a function of depth for the transistor base structure is about 6 nanometers per decade.

9. The transistor base structure of claim 8, wherein the steepness of the profile of dopant concentration is approximately full width at half maximum in less than 10 nanometers.

10. The transistor base structure of claim 8, wherein:
    the buffer layer comprises silicon;
    the dopant comprises phosphorus; and
    the cap layer comprises silicon.

11. The transistor base structure of claim 8, wherein:
    the dopant comprises phosphorus; and
    a concentration of phosphorus is about $3.5*10^{13}$ atoms per square centimeter.

12. The transistor base structure of claim 8, wherein the transistor base structure forms at least part of an SiGe:C heterojunction bipolar transistor (HBT).

13. The transistor base structure of claim 8, wherein:
    the buffer layer has a thickness between about 2 nanometers and about 10 nanometers;
    the SiGe:C layer has a thickness between about 30 nanometers and about 100 nanometers;
    the SiGe:C spacer layer has a thickness between about 2 nanometers and about 20 nanometers; and
    the cap layer has a thickness between about 20 nanometers and about 60 nanometers.

14. The transistor base structure of claim 8, wherein a concentration of germanium and a concentration of carbon are substantially matched in the SiGe:C layer and in the SiGe:C spacer layer.

15. A transistor base structure, comprising:
a silicon buffer layer;
a Silicon Germanium:Carbon (SiGe:C) layer over the buffer layer;
an atomic layer doping (ALD) layer over the SiGe:C layer, the ALD layer comprising a phosphorus dopant; and
a SiGe:C spacer layer over the ALD layer;
wherein a steepness of a profile of dopant concentration as a function of depth for the transistor base structure is optimized to at least 6 nanometers per decade.

16. The transistor base structure of claim 15, wherein the steepness of the profile of dopant concentration is approximately full width at half maximum in less than 10 nanometers.

17. The transistor base structure of claim 15, wherein a concentration of phosphorus is about $3.5*10^{13}$ atoms per square centimeter.

18. The transistor base structure of claim 15, wherein the transistor base structure forms at least part of an SiGe:C heterojunction bipolar transistor (HBT).

19. The transistor base structure of claim 15, wherein:
the buffer layer has a thickness between about 2 nanometers and about 10 nanometers;
the SiGe:C layer has a thickness between about 30 nanometers and about 100 nanometers; and
the SiGe:C spacer layer has a thickness between about 2 nanometers and about 20 nanometers.

20. The transistor base structure of claim 15, wherein a concentration of germanium and a concentration of carbon are substantially matched in the SiGe:C layer and in the SiGe:C spacer layer.

* * * * *